(12) United States Patent
Suzuki

(10) Patent No.: US 7,402,759 B2
(45) Date of Patent: Jul. 22, 2008

(54) PRINTED CIRCUIT BOARD, MAGNETIC DISK DEVICE, AND METHOD FOR MANUFACTURING THE PRINTED CIRCUIT BOARD

(75) Inventor: Daigo Suzuki, Oume (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 461 days.

(21) Appl. No.: 11/123,154

(22) Filed: May 6, 2005

(65) Prior Publication Data

US 2005/0263319 A1  Dec. 1, 2005

(30) Foreign Application Priority Data

May 28, 2004 (JP) .............................. 2004-160327

(51) Int. Cl.
*H01R 12/04* (2006.01)
*H05K 1/11* (2006.01)

(52) U.S. Cl. ..................... 174/262; 174/254; 360/323

(58) Field of Classification Search ............... 174/254, 174/255, 261–266; 360/323; 361/792–795
See application file for complete search history.

(56) References Cited

U.S. PATENT DOCUMENTS 5,800,650 A  9/1998  Anderson et al.
6,650,519 B1 * 11/2003  Karr et al. ...................... 361/58
6,687,097 B1 *  2/2004  Anderson et al. ........... 360/323
6,717,068 B2 *  4/2004  Motonishi et al. ........... 174/261
2001/0030836 A1  10/2001  Katsumata
2002/0140076 A1  10/2002  Yamazaki et al.
2004/0088416 A1  5/2004  Nakatani et al.

FOREIGN PATENT DOCUMENTS

JP        6-028828      2/1994
JP     2003-124579      4/2003

* cited by examiner

*Primary Examiner*—Jeremy C Norris
(74) *Attorney, Agent, or Firm*—Pillsbury Winthrop Shaw Pittman LLP

(57) ABSTRACT

An insulating substrate includes a first area where a semiconductor device is disposed, a second area where a wiring electrically connecting to the semiconductor device is disposed, and a third area where a terminal electrically connecting to the wiring is disposed. A first wiring is disposed on a main surface of the insulating substrate in the second area and connects to the second wiring disposed in the first area and the terminal disposed in the third area through first and second interlayer connecting portions. With this configuration, the second wiring need not be disposed in the second area, so that flexibility in the second area used as a connecting portion increases.

19 Claims, 9 Drawing Sheets

PRINTED CIRCUIT BOARD, MAGNETIC DISK DEVICE, AND METHOD FOR MANUFACTURING THE PRINTED CIRCUIT BOARD

CROSS-REFERENCE TO THE INVENTION

This application is based upon and claims the benefit of priority from the prior Japanese Patent Application No. 2004-160327, filed on May 28, 2004; the entire contents of which are incorporated herein by reference.

BACKGROUND OF THE INVENTION

1. Field of the Invention

The present invention relates to a printed circuit board, a magnetic disk device, and a method for manufacturing the printed circuit board.

2. Description of the Related Art

In order to manufacture a printed circuit board connectable to an electronic device or the like, a main body and a harness protrusion of the printed circuit board may be integrally formed by using a flexible insulating resin film. An example of this technique is disclosed in Japanese Patent Laid-Open Application No. 2003-124579.

SUMMARY OF THE INVENTION

However, even when the main body and the harness protrusion of the printed circuit board are integrally formed by using a flexible insulating resin film, the harness protrusion is not always sufficiently flexible.

In view of this, the present invention provides a printed circuit board having a connecting portion of increased flexibility, the connecting portion connecting a main body of the printed circuit board to an external device, and also provides a magnetic disk device and a method for manufacturing the printed circuit board.

According to an aspect of the present invention, there is provided a printed circuit board including: an insulating substrate including a first area corresponding to a printed circuit board body and a second area corresponding to a printed circuit board connecting portion which connects to the printed circuit board body; a first wiring disposed on a main surface of the insulating substrate in the second area; a first insulating film disposed in the first and second areas while covering the first wiring; a first interlayer connecting portion extending through the first insulating film, disposed near a boundary between the first and second areas, and electrically connecting to the first wiring; a second interlayer connecting portion extending through the first insulating film, disposed near an end portion of the second area, and electrically connecting to the first wiring; a second wiring disposed on the first insulating film in the first area and electrically connecting to the first interlayer connecting portion; and a first terminal disposed at the end portion of the second area and electrically connecting to the second interlayer connecting portion.

The insulating substrate includes the first area corresponding to the printed circuit board body and the second area corresponding to the printed circuit board connecting portion. The first wiring is disposed on the main surface of the insulating substrate in the second area and connects to the second wiring disposed in the first area and the first terminal disposed at the end portion of the second area through the first and second interlayer connecting portions. With this configuration, an area where the second wiring is not disposed can be obtained in the second area, so that flexibility of the printed circuit board connecting portion increases.

DESCRIPTION OF THE EMBODIMENTS

Hereinafter, embodiments of the present invention will be described in detail with reference to the drawings.

First Embodiment

Figure 1A:
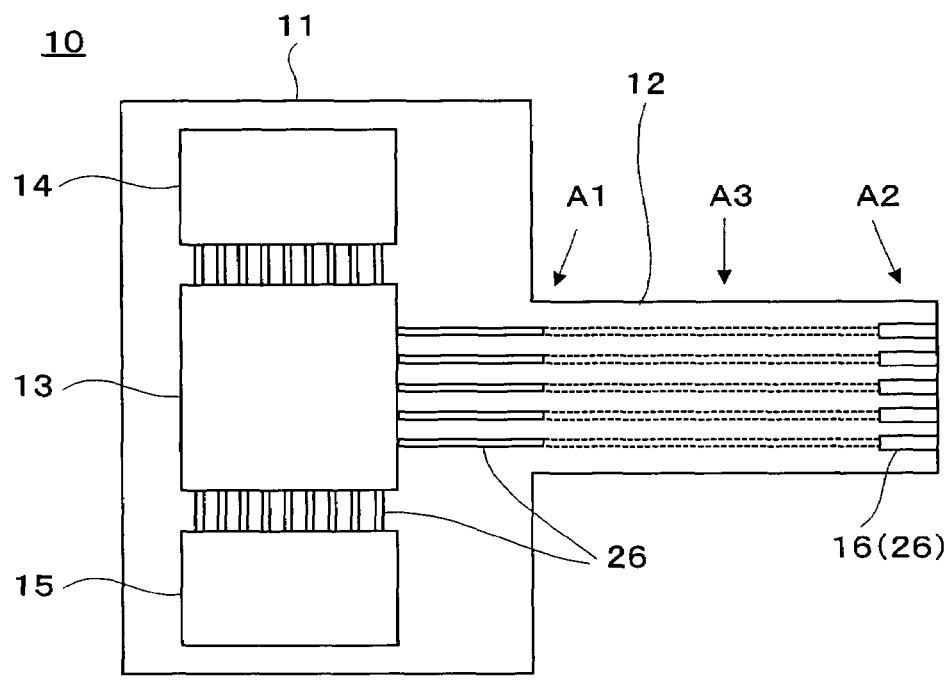
FIG. 1A is a top view showing a top surface of a printed circuit board (PCB) according to a first embodiment of the present invention.
Figure 1B:
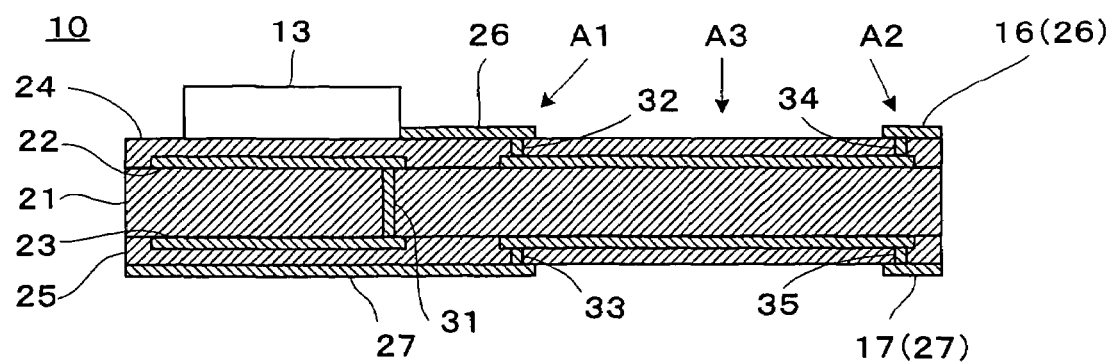
FIG. 1B is a cross-sectional view showing a cross section of the PCB according to the first embodiment of the present invention.

FIGS. 1A and 1B are a top view and a cross-sectional view showing a top surface and a cross section of a printed circuit board (PCB) 10 according to a first embodiment of the present invention.

The PCB 10 is composed of a printed circuit board body (PCB body) 11 and a printed circuit board connecting portion (PCB connecting portion) 12, and includes an insulating substrate 21, wiring patterns 22 and 23, insulating films 24 and 25, and wiring patterns 26 and 27.

The PCB body 11 is provided with electronic components 13 to 15, which perform signal processing.

The PCB connecting portion 12 protrudes from the PCB body 11 in a convex shape. The PCB connecting portion 12 serves to electrically connect the PCB body 11 to an external device, and an end portion thereof is provided with electric contact plugs 16 and 17. The electric contact plugs 16 and 17 function as external connection terminals to electrically connect the PCB 10 to an external device. As will be described later, the PCB connecting portion 12 is formed to have flexibility.

The insulating substrate 21 is a substrate having an insulation performance and is configured to integrate the PCB body 11 and the PCB connecting portion 12.

The insulating substrate 21 is made of, for example, a polyimide resin or a fiber-reinforced resin. Specifically, by impregnating a textile (a nonwoven fabric or the like) with a resin such as an epoxy resin and curing the resin, a resin-impregnated fiber material (or a fiber-reinforced resin) can be prepared. By using the resin-impregnated fiber material for the insulating substrate 21, flexibility of the insulating substrate 21 can be increased. As the fiber material, an aramid fiber or the like can be used. The aramid fiber is a polyamide fiber having an aromatic (benzene ring) skeleton (aromatic polyamide fiber) and is highly heat resistant.

The wiring patterns 22 and 23 are disposed on both surfaces of the insulating substrate 21, each wiring pattern being a group of traces integrally disposed in the PCB body 11 and the PCB connecting portion 12. Each of the wiring patterns 22 and 23 can be obtained by forming a conductive film of metal (e.g., copper) or the like on the insulating substrate 21 and by patterning the film by etching or the like.

Each of the wiring patterns 22 and 23 is used for a wiring on the PCB body 11 side and a wiring on the PCB connecting portion 12 side. The wiring on the PCB 11 side and the wiring on the PCB connecting portion 12 side are separated from each other on the PCB body 11 side.

The wiring patterns 22 and 23 on the PCB body 11 side electrically connect to each other through an interlayer connecting portion 31. The interlayer connecting portion 31 is a conductor extending through the insulating substrate 21 and is made of a conductive paste or the like.

The insulating films 24 and 25 are disposed on the wiring patterns 22 and 23, respectively (on the insulating substrate 21 in an area where the wiring patterns 22 and 23 do not exist), while extending in the PCB body 11 and the PCB connecting portion 12. Each of the insulating films 24 and 25 is made of an organic or inorganic material, for example, made of a resin-impregnated fiber material (e.g., an aramid fiber impregnated with an epoxy resin) as in the insulating substrate 21.

The wiring patterns 26 and 27 are disposed on the insulating films 24 and 25, respectively, each wiring pattern being a group of traces integrally disposed in the PCB body 11 and the PCB connecting portion 12.

Each of the wiring patterns 26 and 27 is used for a wiring on the PCB body 11 side and a wiring on the PCB connecting portion 12 side (electric contact plug 16 or 17). The wiring on the PCB body 11 side and the wiring on the PCB connecting portion 12 side are separated from each other on the PCB connecting portion 12 side.

In other words, the wiring patterns 26 and 27 are disposed in areas A1 and A2 near both ends of the PCB connecting portion 12, but do not exist in an area A3 between the areas A1 and A2. Since the wiring patterns 26 and 27 do not exist in the area A3, that is, at a center of the PCB connecting portion 12 in its width direction, flexibility of the PCB connecting portion 12 can be increased.

Herein, the "width direction" means a direction substantially perpendicular to a wiring direction of the PCB connecting portion 12. The area A3 extends over an entire area in the width direction of the PCB connecting portion 12. Accordingly, the flexibility in a longitudinal direction (the wiring direction) of the PCB connecting portion 12 increases.

On the other hand, the area A3 does not cover an entire area in the longitudinal direction of the PCB connecting portion 12 (areas A1 and A2 exist). This is because the existence of the wiring patterns 26 and 27 (in the areas A1 and A2) in the longitudinal direction of the PCB connecting portion 12 does not inhibit an increase in the flexibility in the longitudinal direction (the wiring direction) of the PCB connecting portion 12 (flexibility should be increased in the area A3).

In the area A3 of the PCB connecting portion 12, only the insulating substrate 21, the wiring patterns 22 and 23, and the insulating films 24 and 25 are disposed, but the wiring patterns 26 and 27 are not disposed therein. Therefore, the number of layers in the area A3 is less than that of the PCB body 11. Further, the wiring patterns 26 and 27 are usually made of metal and thus are often less flexible than the insulating films 24 and 25 and the insulating substrate 21, which are usually made of an organic material. In this way, by providing the wiring patterns 26 and 27 only in the areas A1 and A2, but not in the area A3, a higher flexibility can be obtained than in a case where the number of layers is just reduced.

The wiring patterns 26 and 27 in the area A1 electrically connect to the wiring patterns 22 and 23 through interlayer connecting portions 32 and 33, respectively. The wiring patterns 26 and 27 in the area A2 electrically connect to the wiring patterns 22 and 23 through interlayer connecting portions 34 and 35, respectively. In other words, wirings in the areas A1 and A2 of the wiring pattern 26 electrically connect to each other through the interlayer connecting portion 32, the wiring pattern 22, and the interlayer connecting portion 34. Likewise, wirings in the areas A1 and A2 of the wiring pattern 27 electrically connect to each other through the interlayer connecting portion 33, the wiring pattern 23, and the interlayer connecting portion 35. With this configuration, electrical connection between the wirings of the respective wiring patterns 26 and 27 is ensured even if the wirings are separated in the area A3.

The wiring pattern 26 in the area A1 electrically connects to the electronic component 13. The wiring pattern 26 in the area A2 electrically connects to the electric contact plug 16. Accordingly, the electronic component 13 electrically connects to the electric contact plug 16.

The wiring pattern 27 in the area A1 electrically connects to any of the electronic components 13 to 15 through an interlayer connecting portion (not shown) in the PCB body 11. The wiring pattern 27 in the area A2 electrically connects to the electric contact plug 17. Accordingly, the electronic component 13 or the like electrically connects to the electric contact plug 17.

Herein, the wiring patterns 26 and 27 in the area A1 may exist only in the PCB body 11, not both in the PCB body 11 and the PCB connecting portion 12. Even in this case, electrical connection between the areas A1 and A2 can be ensured in the respective wiring patterns 26 and 27.

(Process of Manufacturing the PCB 10)

Hereinafter, a process of manufacturing the PCB 10 will be described.

Figure 2:
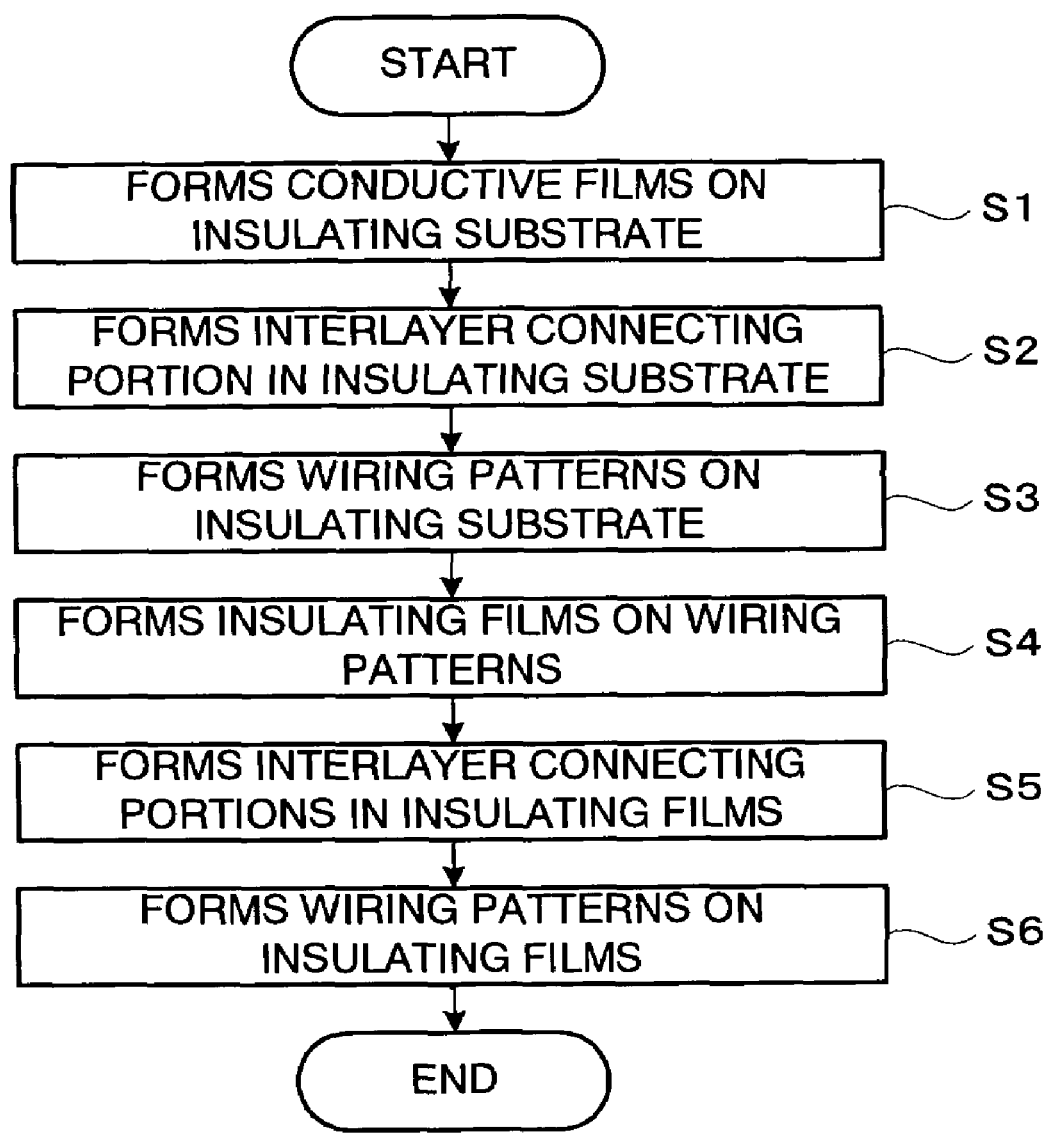
FIG. 2 is a flowchart showing an example of a process of manufacturing the PCB.
Figure 3A:
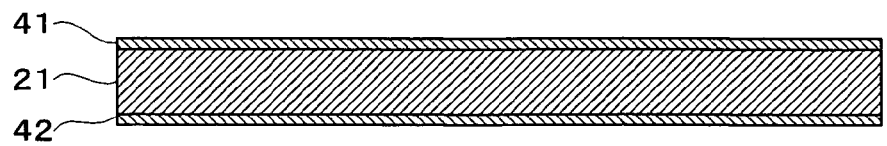
FIGS. 3A to 3F are cross-sectional views showing respective states of the PCB in the manufacturing process shown in FIG. 2.
Figure 3B:
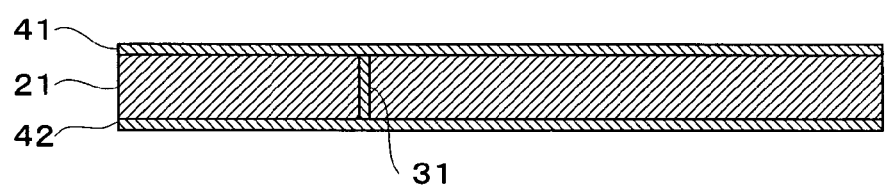
Figure 3C:
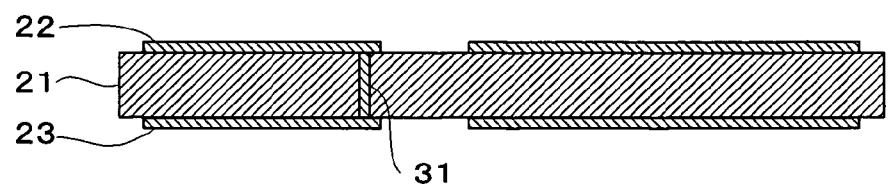
Figure 3D:
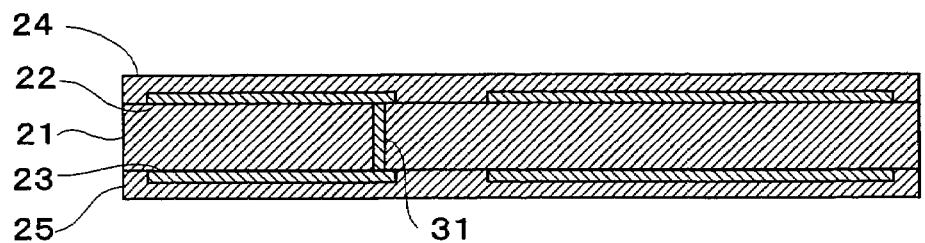
Figure 3E:
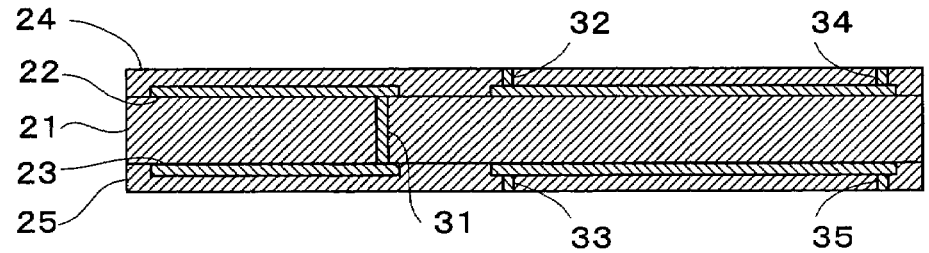
Figure 3F:
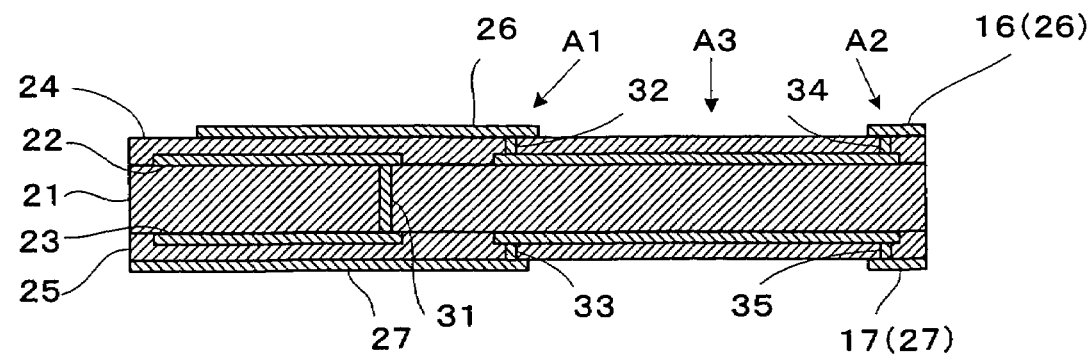

FIG. 2 is a flowchart showing an example of the process of manufacturing the PCB 10. FIGS. 3A to 3F are cross-sectional views showing respective states of the PCB 10 in the manufacturing process shown in FIG. 2.

For a clear understanding, the process is described assuming that upper and lower sides of the PCB 10 are formed at the same time. However, the both sides need not be formed at the same time, and a forming procedure can be adequately set. For example, the upper side may be formed first and then the lower side may be formed.

A. Formation of Conductive Films 41 and 42 on the Insulating Substrate 21 (step S1, FIG. 3A)

As the insulating substrate 21, a resin-impregnated fiber substrate, which is prepared by impregnating an aramid fiber with an epoxy resin and curing the resin, can be used. Conductive films 41 and 42 of copper or the like are formed on the insulating substrate 21. The conductive films 41 and 42 can be formed by a physical deposition method, such as sputtering, or a chemical deposition method, such as electroless plating. It can be difficult to obtain an adequate film thickness by the spattering or electroless plating. In that case, electrolytic plating is used to obtain the adequate film thickness.

B. Formation of the Interlayer Connecting Portion 31 in the Insulating Substrate 21 (step S2, FIG. 3B)

The interlayer connecting portion 31 for connecting the conductive films 41 and 42 is formed in the insulating substrate 21. This step is carried out in the following manner, for example.

1) Form a hole extending through the insulating substrate 21 (through hole), for example, in a mechanical manner by using a small drill or the like.

2) Form a conductive film in the through hole, for example, by electroplating the conductive films 41 and 42.

3) Fill the through hole with a conductive paste and cure the paste.

In the above-described procedure, the film formed on the conductive films 41 and 42 by electroplating is removed and a conductive paste spilled from the through hole is removed as necessary.

C. Formation of the Wiring Patterns 22 and 23 on the Insulating Substrate 21 (step S3, FIG. 3C)

The wiring patterns 22 and 23 are formed by patterning the conductive films 41 and 42 on the insulating substrate 21. The patterning is carried out by, for example, coating the conductive films 41 and 42 by a resist, patterning the resist by exposure or the like, patterning the conductive films 41 and 42 by chemical or physical etching, and removing the resist.

D. Formation of the Insulating Films 24 and 25 on the Wiring Patterns 22 and 23 (step S4, FIG. 3D)

The insulating films 24 and 25 are formed on the wiring patterns 22 and 23, for example, by laminating and curing a resin-impregnated fiber material (e.g., an aramid fiber impregnated with an epoxy resin).

E. Formation of the Interlayer Connecting Portions 32 to 35 in the Insulating Films 24 and 25 (step S5, FIG. 3E)

The interlayer connecting portions 32 and 34 for connecting the wiring patterns 22 and 26 are formed in the insulating film 24, and the interlayer connecting portions 33 and 35 for connecting the wiring patterns 23 and 27 are formed in the insulating film 25. This step is carried out in the following manner.

1) Form holes extending through the insulating films 24 and 25 (through holes), for example, by gathering laser light or the like to heat the insulating films. By forming the through holes, part of the wiring patterns 22 and 23 is exposed. That is, the through holes need not extend through the wiring patterns 22 and 23 and the insulating substrate 21.

2) Fill the through holes with a conductor, for example, by performing electroless plating on the insulating films 24 and 25. By performing the electroless plating, a plating film of copper or the like is formed on the insulating films 24 and 25, the through holes, and the wiring patterns 22 and 23 at bottom portions of the through holes.

F. Formation of the Wiring Patterns 26 and 27 on the Insulating Films 24 and 25 (Step S6, FIG. 3F)

The wiring patterns 26 and 27 are formed on the insulating films 24 and 25, respectively. This step can be carried out by, for example, forming a conductive film, coating the film by a resist, patterning the resist by exposure or the like, patterning the film by chemical or physical etching, and removing the resist.

Alternatively, the step can be carried out by using the step of forming the interlayer connecting portions 32 and 33. That is, after the interlayer connecting portions 32 and 33 are formed by electroless plating or the like, plating films remain on the insulating films 24 and 25. By patterning the plating films, the wiring patterns 26 and 27 can be formed. Since it is typically difficult to obtain an adequate film thickness by electroless plating, electrolytic plating is performed as necessary on the electroless plating film after patterning.

In the above-described manner, the wiring patterns 26 and 27 are formed. At this time, the wiring patterns 26 and 27 are not formed in the area A3 in order to increase the flexibility of the PCB connecting portion 12.

Then, a solder mask (protective film against adhesion of solder) is formed on the wiring patterns 26 and 27 as necessary to protect them from the outside. Since the wiring patterns 26 and 27 are not disposed in the area A3, the solder mask need not be formed in the area A3. This further increases the flexibility of the PCB connecting portion 12.

Further, individual PCBs 10 are obtained from the substrate 21 and so on, because a plurality of PCBs 10 are typically formed at a time. Then, the electronic components 13 to 15 are mounted on the PCBs 10.

Second Embodiment

Figure 4A:
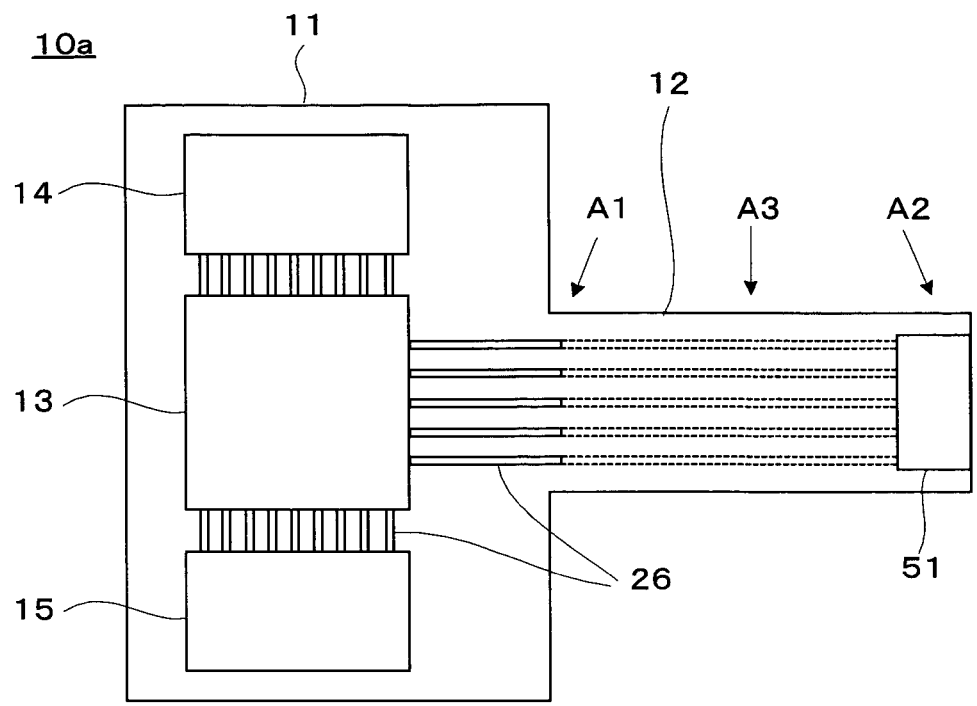
FIG. 4A is a top view showing a top surface of a PCB according to a second embodiment of the present invention.
Figure 4B:
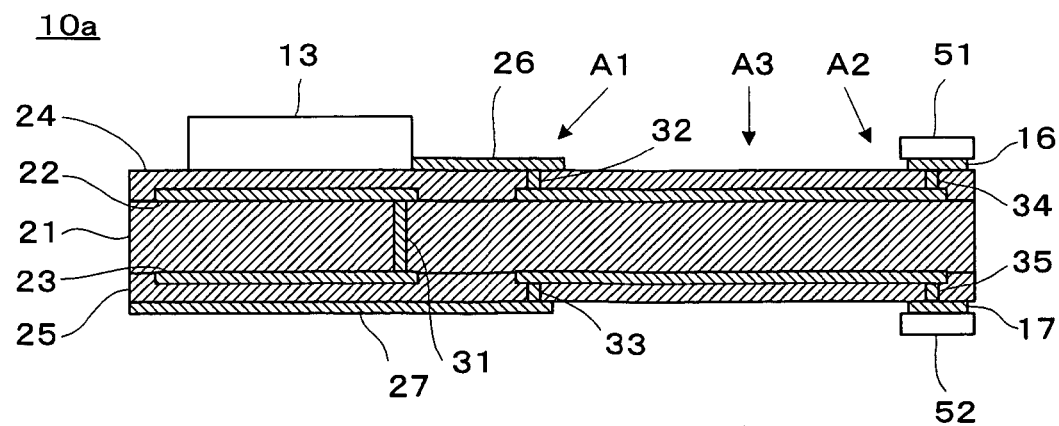
FIG. 4B is a cross-sectional view showing a cross section of the PCB according to the second embodiment of the present invention.

FIGS. 4A and 4B are a top view and a cross-sectional view showing a top surface and a cross section of a PCB 10a according to a second embodiment of the present invention.

In the PCB 10a, connectors 51 and 52 are attached at an end portion of the PCB connecting portion 12. The other parts are substantially the same as those in the first embodiment, and thus a description thereof will be omitted.

Third Embodiment

Figure 5A:
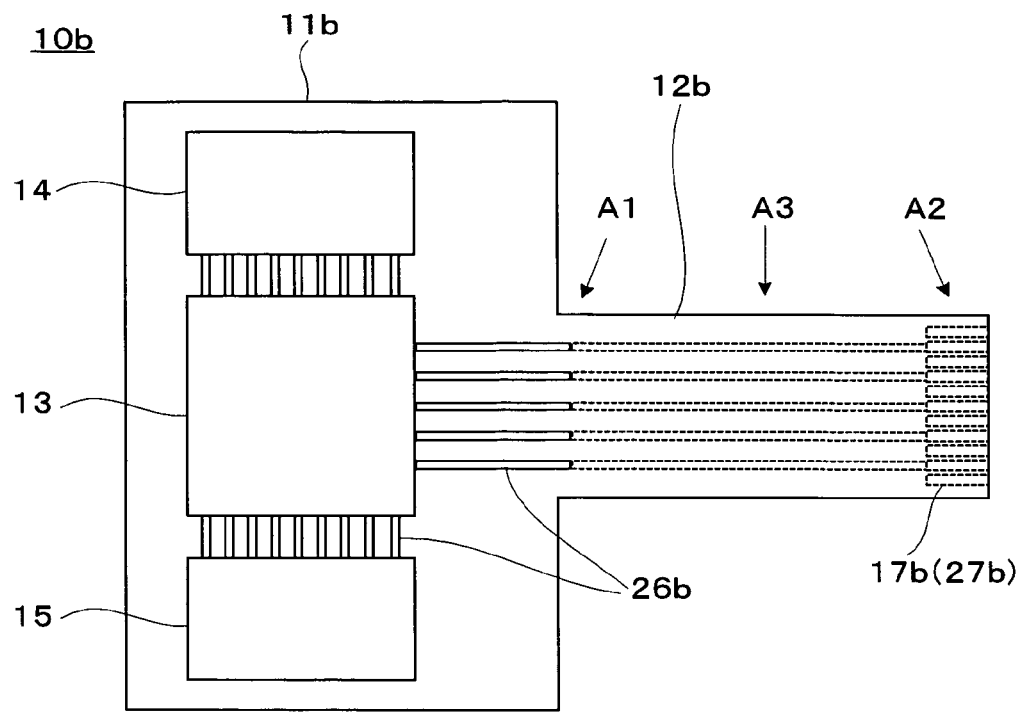
FIG. 5A is a top view showing a top surface of a PCB according to a third embodiment of the present invention.
Figure 5B:
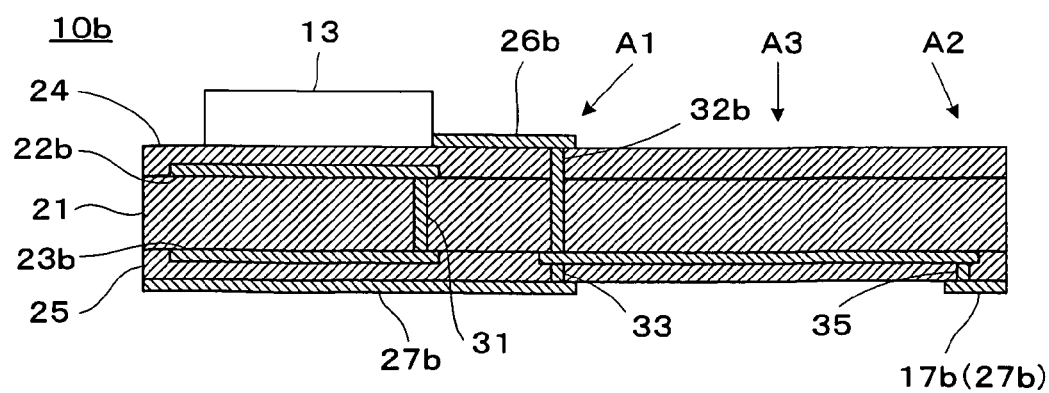
FIG. 5B is a cross-sectional view showing a cross section of the PCB according to the third embodiment of the present invention.

FIGS. 5A and 5B are a top view and a cross-sectional view showing a top surface and a cross section of a PCB 10b according to a third embodiment of the present invention.

In the PCB 10b, wiring patterns 22b and 23b are provided instead of the wiring patterns 22 and 23. The wiring pattern 22b is not disposed on a PCB connecting portion 12b side. On the other hand, the wiring pattern 23b is used for a wiring on a PCB body 11b side and a wiring on the PCB connecting portion 12b side. Further, the wiring on the PCB connecting portion 12b side is used for a first wiring portion connecting to the wiring pattern 22b on the PCB body 11b side and a second wiring portion connecting to the wiring pattern 23b on the PCB body 11b side. These first and second wiring portions are insulated from each other as necessary.

In the PCB 10b, an electric contact plug 17b, instead of the electric contact plugs 16 and 17, is disposed on only a lower side. The electric contact plug 17b includes terminals connecting to wiring patterns 26b and 27b on the PCB body 11b side. Therefore, the number of terminals in the electric contact plug 17b is equal to the number of terminals in the electric contact plugs 16 and 17.

In the area A1, the wiring pattern 26b connects to the first wiring portion of the wiring pattern 23b on the PCB connecting portion 12b side through an interlayer connecting portion 32b. The first wiring portion connects to the electric contact plug 17b in the area A2. Accordingly, the wiring pattern 26b on the PCB body 11 side connects to the electric contact plug 17b through the wiring pattern 23b on the PCB connecting portion 12*b* side. By electrically connecting the wiring patterns 22*b*, 26*b*, and 27*b* on the PCB body 11*b* side to the wiring pattern 23*b* on the PCB connecting portion 12*b* side directly or indirectly, electrical connection with an external device through the PCB connecting portion 12*b* can be ensured.

The other parts are substantially the same as those in the first embodiment, and thus a description thereof will be omitted.

Fourth Embodiment

Figure 6A:
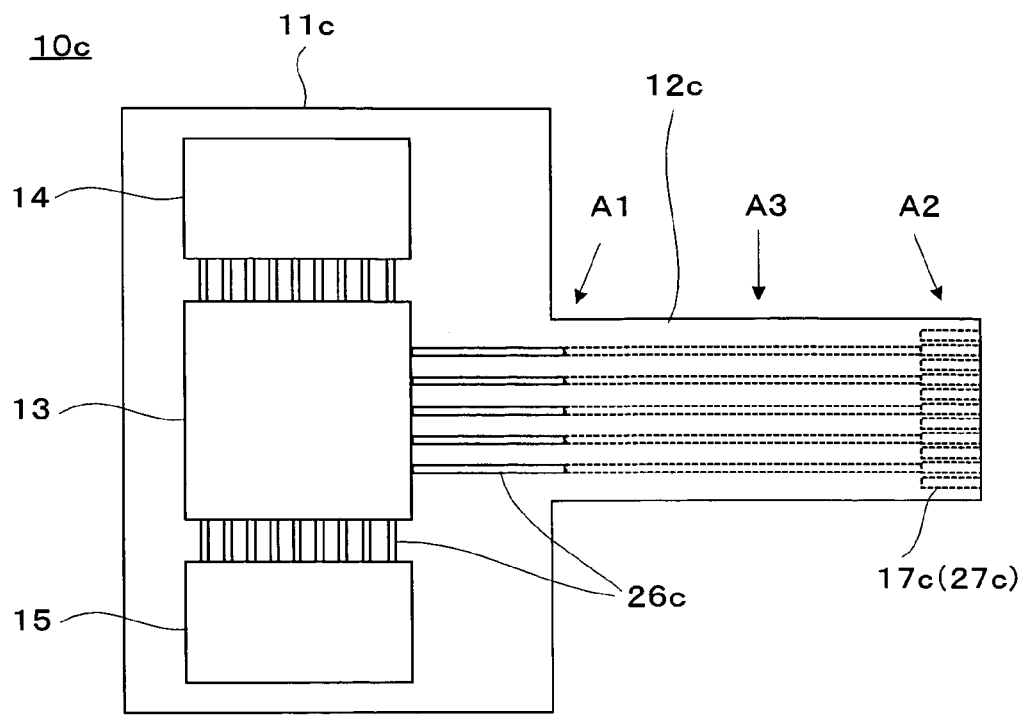
FIG. 6A is a top view showing a top surface of a PCB according to a fourth embodiment of the present invention.
Figure 6B:
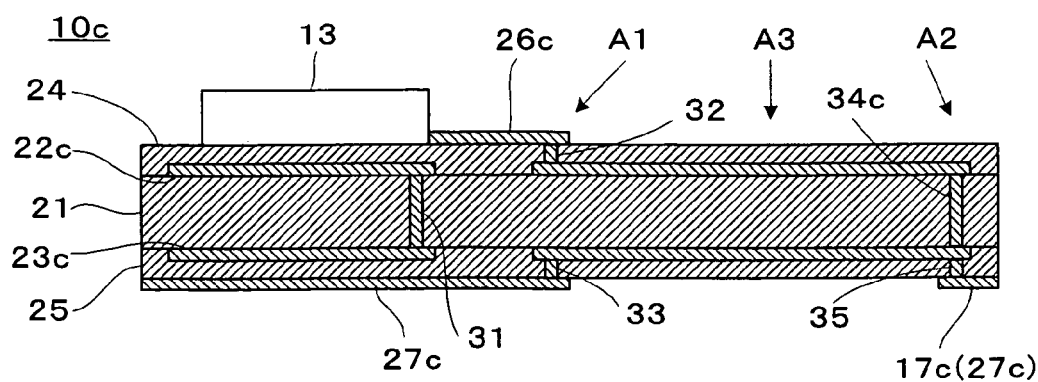
FIG. 6B is a cross-sectional view showing a cross section of the PCB according to the fourth embodiment of the present invention.

FIGS. 6A and 6B are a top view and a cross-sectional view showing a top surface and a cross section of a PCB 10*c* according to a fourth embodiment of the present invention.

In the PCB 10*c*, wiring patterns 22*c* and 23*c* are provided instead of the wiring patterns 22 and 23. Each of the wiring patterns 22*c* and 23*c* is used for a wiring on a PCB body 11*c* side and a wiring on a PCB connecting portion 12*c* side.

In the PCB 10*c*, an electric contact plug 17*c*, instead of the electric contact plugs 16 and 17, is disposed on only a lower side. The electric contact plug 17*c* includes terminals connecting to wiring patterns 26*c* and 27*c* on the PCB body 11*c* side. Therefore, the number of terminals in the electric contact plug 17*c* is equal to the number of terminals in the electric contact plugs 16 and 17.

In the area A1, the wiring pattern 26*c* connects to the wiring pattern 22*c* on the PCB connecting portion 12*c* side through the interlayer connecting portion 32. The wiring pattern 22*c* on the PCB connecting portion 12*c* side connects to the electric contact plug 17*c* in the area A2. Accordingly, the wiring pattern 26*c* connects to the electric contact plug 17*c* through the wiring pattern 22*c*.

The other parts are substantially the same as those in the first embodiment, and thus a description thereof will be omitted.

Fifth Embodiment

Figure 7A:
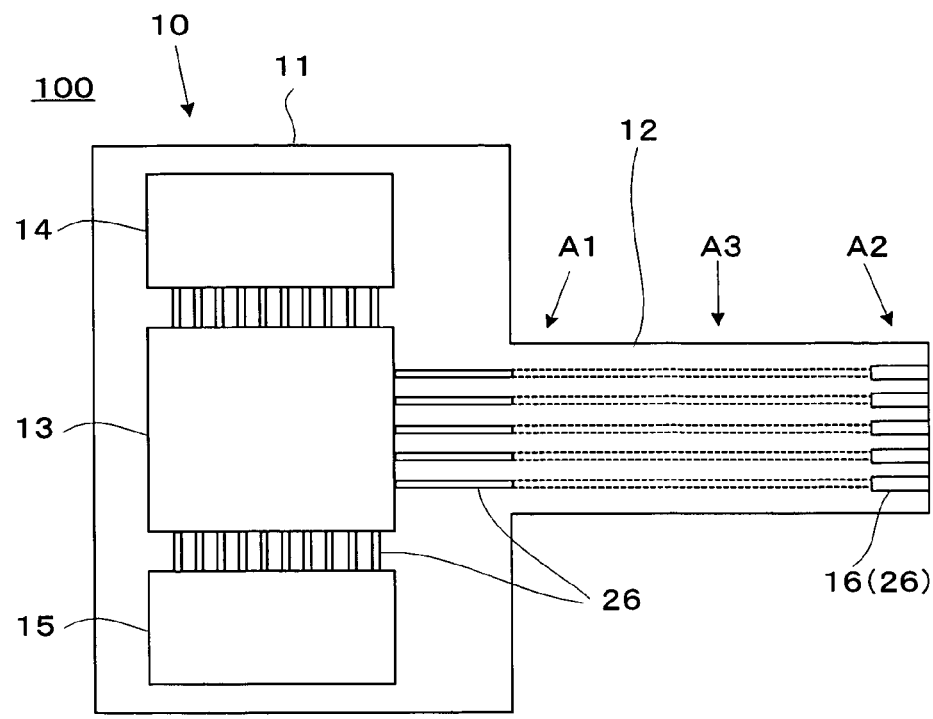
FIG. 7A is a top view showing a top surface of a magnetic disk device according to a fifth embodiment of the present invention.
Figure 7B:
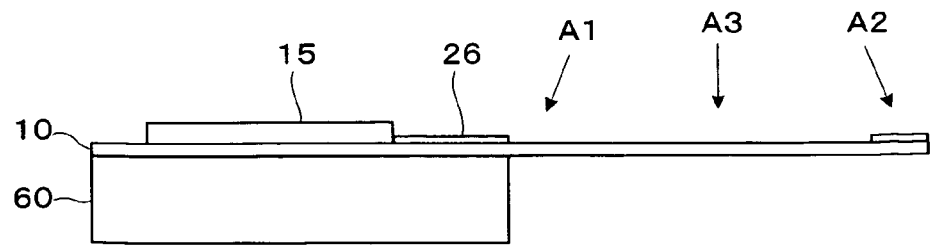
FIG. 7B is a side view showing a side of the magnetic disk device according to the fifth embodiment of the present invention.

FIGS. 7A and 7B are a top view and a side view showing a top surface and a side of a magnetic disk device 100 according to a fifth embodiment of the present invention.

The magnetic disk device 100 includes the PCB 10 and a magnetic disk drive 60 connecting thereto on a lower surface of the PCB 10. The magnetic disk device 100 is covered by a casing (not shown) as necessary, so to be protected from the outside.

Figure 8:
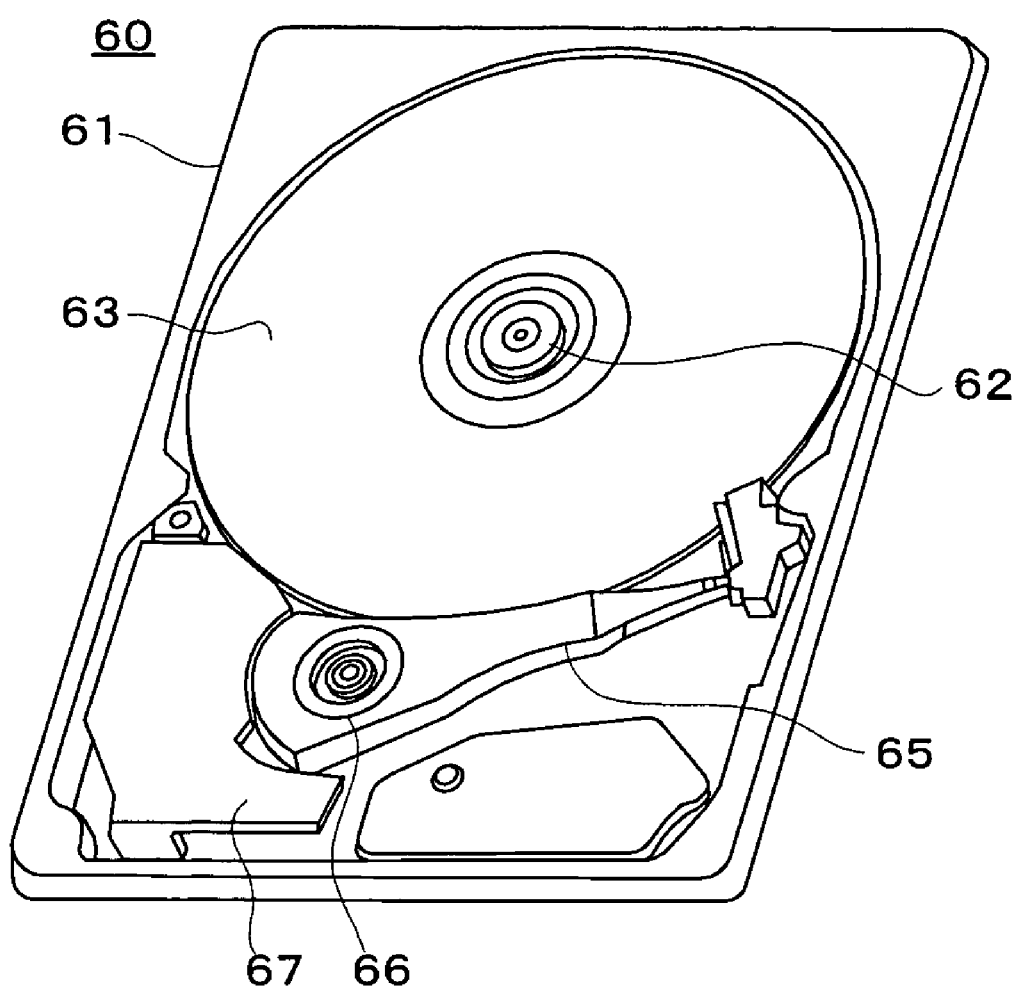
FIG. 8 is a perspective view showing a magnetic disk drive shown in FIGS. 7A and 7B.

FIG. 8 is a perspective view showing the magnetic disk drive 60 shown in FIG. 7A viewed from a rear side. The magnetic disk drive 60 includes a base 61, a spindle motor 62, a magnetic disk 63, a head subassembly 65, a bearing unit 66, and a voice coil motor 67.

The PCB 10 is substantially the same as that in the first embodiment, and thus a description thereof will be omitted.

Other Embodiments

The above-described embodiments of the present invention can be expanded or modified, and the expanded or modified embodiments are included in the technical scope of the present invention.

For example, the wiring patterns 22, 23, 26, and 27 are disposed on both sides of the insulating substrate 21 in the first embodiment, but the wiring patterns may be disposed on only one side. Further, the number of layers of the wiring patterns may be increased, for example, from four layers in the first embodiment to six layers. In that case, an insulating layer and a wiring pattern are disposed on each of the wiring patterns 26 and 27.

In the third embodiment, the wiring pattern 22*b* is not disposed in the width direction of the PCB connecting portion 12*b*. Alternatively, the wiring pattern 23*b* may not be disposed in the width direction of the PCB connecting portion 12*b*. That is, electrical connection in the PCB connecting portion 12 may be ensured by any one of the wiring patterns 22, 23, 26, and 27.

What is claimed is:

1. A printed circuit board, comprising:
an insulating substrate including a first area corresponding to a printed circuit board body and a second area corresponding to a printed circuit board connecting portion which connects to the printed circuit board body;
a first wiring disposed on a main surface of the insulating substrate in the second area;
a first insulating film disposed in the first and second areas while covering the first wiring;
a first interlayer connecting portion extending through the first insulating film, disposed near a boundary between the first and second areas, and electrically connecting to the first wiring;
a second interlayer connecting portion extending through the first insulating film, disposed near an end portion of the second area, and electrically connecting to the first wiring;
a second wiring disposed on the first insulating film in the first area and electrically connecting to the first interlayer connecting portion; and
a first terminal disposed at the end portion of the second area and electrically connecting to the second interlayer connecting portion.

2. A printed circuit board according to claim 1, further comprising:
a third wiring disposed in the first area while being flush with the first wiring and being electrically insulated from the first wiring.

3. A printed circuit board according to claim 1, further comprising:
a third wiring disposed in the second area while being flush with and parallel with the first wiring;
a second insulating film disposed on the second wiring;
a third interlayer connecting portion extending through the first and second insulating films, disposed near a boundary between the first and second areas, and electrically connecting to the third wiring; and
a fourth wiring disposed on the second insulating film in the first area and electrically connecting to the third interlayer connecting portion.

4. A printed circuit board according to claim 1, further comprising:
a third wiring disposed on another main surface opposite to the main surface of the insulating substrate in the second area;
a second insulating film disposed in the first and second areas while covering the third wiring;
a third interlayer connecting portion extending through the second insulating film, disposed near a boundary between the first and second areas, and electrically connecting to the third wiring;
a fourth interlayer connecting portion extending through the second insulating film, disposed near the end portion of the second area, and electrically connecting to the third wiring;

a fourth wiring disposed on the second insulating film in the first area and electrically connecting to the third interlayer connecting portion; and a terminal disposed at the end portion of the second area and electrically connecting to the fourth interlayer connecting portion.

5. A printed circuit board according to claim 1, further comprising:

a third wiring disposed on another main surface opposite to the main surface of the insulating substrate in the second area;

a second insulating film disposed in the first and second areas while covering the third wiring;

a third interlayer connecting portion extending through the second insulating film, disposed near a boundary between the first and second areas, and electrically connecting to the third wiring;

a fourth interlayer connecting portion extending through the second insulating film and the insulating substrate, disposed near the end portion of the second area, and electrically connecting to the third wiring;

a fourth wiring disposed on the second insulating film in the first area and electrically connecting to the third interlayer connecting portion; and a second terminal disposed at the end portion of the second area and electrically connecting to the fourth interlayer connecting portion.

6. A printed circuit board according to claim 1, further comprising:

a third wiring disposed on another main surface opposite to the main surface of the insulating substrate in the first area; and a third interlayer connecting portion extending through the insulating substrate, disposed near a boundary between the first and second areas, and electrically connecting to the first and third wirings.

7. A printed circuit board according to claim 6, further comprising:

a second insulating film disposed between the insulating substrate and the third wiring.

8. A magnetic disk device including a printed circuit board, the printed circuit board comprising:

an insulating substrate including a first area corresponding to a printed circuit board body and a second area corresponding to a printed circuit board connecting portion which connects to the printed circuit board body;

a first wiring disposed on a main surface of the insulating substrate in the second area;

a first insulating film disposed in the first and second areas while covering the first wiring;

a first interlayer connecting portion extending through the first insulating film, disposed near a boundary between the first and second areas, and electrically connecting to the first wiring;

a second interlayer connecting portion extending through the first insulating film, disposed near an end portion of the second area, and electrically connecting to the first wiring;

a second wiring disposed on the first insulating film in the first area and electrically connecting to the first interlayer connecting portion; and a first terminal disposed at the end portion of the second area and electrically connecting to the second interlayer connecting portion.

9. A magnetic disk device according to claim 8, the printed circuit board further comprising:

a third wiring disposed in the first area while being flush with the first wiring and being electrically insulated from the first wiring.

10. A magnetic disk device according to claim 8, the printed circuit board, further comprising:

a third wiring disposed in the second area while being flush with and parallel with the first wiring;

a second insulating film disposed on the second wiring;

a third interlayer connecting portion extending through the first and second insulating films, disposed near a boundary between the first and second areas, and electrically connecting to the third wiring; and a fourth wiring disposed on the second insulating film in the first area and electrically connecting to the third interlayer connecting portion.

11. A magnetic disk device according to claim 8, wherein the printed circuit board, further comprising:

a third wiring disposed on another main surface opposite to the main surface of the insulating substrate in the second area;

a second insulating film disposed in the first and second areas while covering the third wiring;

a third interlayer connecting portion extending through the second insulating film, disposed near a boundary between the first and second areas, and electrically connecting to the third wiring;

a fourth interlayer connecting portion extending through the second insulating film, disposed near the end portion of the second area, and electrically connecting to the third wiring;

a fourth wiring disposed on the second insulating film in the first area and electrically connecting to the third interlayer connecting portion; and a terminal disposed at the end portion of the second area and electrically connecting to the fourth interlayer connecting portion.

12. A magnetic disk device according to claim 8, wherein the printed circuit board, further comprising:

a third wiring disposed on another main surface opposite to the main surface of the insulating substrate in the second area;

a second insulating film disposed in the first and second areas while covering the third wiring;

a third interlayer connecting portion extending through the second insulating film, disposed near a boundary between the first and second areas, and electrically connecting to the third wiring;

a fourth interlayer connecting portion extending through the second insulating film and the insulating substrate, disposed near the end portion of the second area, and electrically connecting to the third wiring;

a fourth wiring disposed on the second insulating film in the first area and electrically connecting to the third interlayer connecting portion; and a second terminal disposed at the end portion of the second area and electrically connecting to the fourth interlayer connecting portion.

13. A magnetic disk device according to claim 8, wherein the printed circuit board, further comprising:

a third wiring disposed on another main surface opposite to the main surface of the insulating substrate in the first area; and a third interlayer connecting portion extending through the insulating substrate, disposed near a boundary between the first and second areas, and electrically connecting to the first and third wirings.

14. A magnetic disk device according to claim 13, wherein the printed circuit board, further comprising:
a second insulating film disposed between the insulating substrate and the third wiring.

15. A method for manufacturing a printed circuit board, comprising:
preparing an insulating substrate including a first area corresponding to a printed circuit board body and a second area corresponding to a printed circuit board connecting portion which connects to the printed circuit board body;
forming a first wiring disposed on a main surface of the insulating substrate in the second area;
forming a first insulating film disposed in the first and second areas while covering the first wiring;
forming a first interlayer connecting portion extending through the first insulating film, disposed near a boundary between the first and second areas, and electrically connecting to the first wiring;
forming a second interlayer connecting portion extending through the first insulating film, disposed near an end portion of the second area, and electrically connecting to the first wiring;
forming a second wiring disposed on the first insulating film in the first area and electrically connecting to the first interlayer connecting portion; and
forming a first terminal disposed at the end portion of the second area and electrically connecting to the second interlayer connecting portion.

16. A method according to claim 15, further comprising:
forming a third wiring disposed in the second area while being flush with and parallel with the first wiring;
forming a second insulating film disposed on the second wiring;
forming a third interlayer connecting portion extending through the first and second insulating films, disposed near a boundary between the first and second areas, and electrically connecting to the third wiring; and
forming a fourth wiring disposed on the second insulating film in the first area and electrically connecting to the third interlayer connecting portion.

17. A method according to claim 15, further comprising:
forming a third wiring disposed on another main surface opposite to the main surface of the insulating substrate in the second area;
forming a second insulating film disposed in the first and second areas while covering the third wiring;
forming a third interlayer connecting portion extending through the second insulating film, disposed near a boundary between the first and second areas, and electrically connecting to the third wiring;
forming a fourth interlayer connecting portion extending through the second insulating film, disposed near the end portion of the second area, and electrically connecting to the third wiring;
forming a fourth wiring disposed on the second insulating film in the first area and electrically connecting to the third interlayer connecting portion; and
forming a terminal disposed at the end portion of the second area and electrically connecting to the fourth interlayer connecting portion.

18. A method according to claim 15, further comprising:
forming a third wiring disposed on another main surface opposite to the main surface of the insulating substrate in the second area;
forming a second insulating film disposed in the first and second areas while covering the third wiring;
forming a third interlayer connecting portion extending through the second insulating film, disposed near a boundary between the first and second areas, and electrically connecting to the third wiring;
forming a fourth interlayer connecting portion extending through the second insulating film and the insulating substrate, disposed near the end portion of the second area, and electrically connecting to the third wiring;
forming a fourth wiring disposed on the second insulating film in the first area and electrically connecting to the third interlayer connecting portion; and
forming a second terminal disposed at the end portion of the second area and electrically connecting to the fourth interlayer connecting portion.

19. A method according to claim 15, further comprising:
forming a third wiring disposed on another main surface opposite to the main surface of the insulating substrate in the first area; and
forming a third interlayer connecting portion extending through the insulating substrate, disposed near a boundary between the first and second areas, and electrically connecting to the first and third wirings.

* * * * *